(12) United States Patent
Hung

(10) Patent No.: US 7,224,173 B2
(45) Date of Patent: May 29, 2007

(54) ELECTRICAL BIAS ELECTRICAL TEST APPARATUS AND METHOD

(75) Inventor: Hui-Chuan Hung, Taichung (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 0 days.

(21) Appl. No.: 10/677,155

(22) Filed: Oct. 1, 2003

(65) Prior Publication Data

US 2005/0073331 A1  Apr. 7, 2005

(51) Int. Cl.
*G01R 31/305* (2006.01)
*G01R 31/02* (2006.01)
*G01R 31/26* (2006.01)

(52) U.S. Cl. .................... 324/751; 324/754; 324/762; 324/158.1

(58) Field of Classification Search ............. 324/158.1, 324/750–765
See application file for complete search history.

(56) References Cited

U.S. PATENT DOCUMENTS

| | | | | |
|---|---|---|---|---|
| 5,091,692 A | * | 2/1992 | Ohno et al. | 324/758 |
| 5,465,046 A | * | 11/1995 | Campbell et al. | 324/244 |
| 5,493,236 A | * | 2/1996 | Ishii et al. | 324/752 |
| 5,973,504 A | * | 10/1999 | Chong | 324/754 |
| 6,268,719 B1 | * | 7/2001 | Swart | 324/158.1 |
| 6,462,814 B1 | | 10/2002 | Lo | |
| 6,469,528 B2 | * | 10/2002 | Akikuni et al. | 324/752 |
| 6,686,753 B1 | * | 2/2004 | Kitahata | 324/754 |
| 6,747,464 B1 | * | 6/2004 | Blackwood | 324/752 |
| 6,777,964 B2 | * | 8/2004 | Navratil et al. | 324/754 |
| 6,842,029 B2 | * | 1/2005 | Howland | 324/765 |
| 7,071,713 B2 | * | 7/2006 | Furukawa et al. | 324/750 |
| 2002/0053917 A1 | * | 5/2002 | Tanioka et al. | 324/754 |

OTHER PUBLICATIONS

Bruce et al, "Soft Devect Localization (SDL) on ICs", Proc. 28th Int. Symp. for Testing and Failure Analysis, Nov. 3-7, 2002, Phoenix, AZ, pp. 21-27.

* cited by examiner

*Primary Examiner*—Ha Tran Nguyen
*Assistant Examiner*—Emily Y Chan
(74) *Attorney, Agent, or Firm*—Tung & Associates

(57) ABSTRACT

An apparatus and a method for electrically testing a microelectronic product employ an electrical probe tip for electrically stressing a portion of the microelectronic product other than an electrical contact portion of the microelectronic product when electrically testing the microelectronic product. The apparatus and the method provide for more accurate and efficient electrical testing of the microelectronic product.

17 Claims, 2 Drawing Sheets

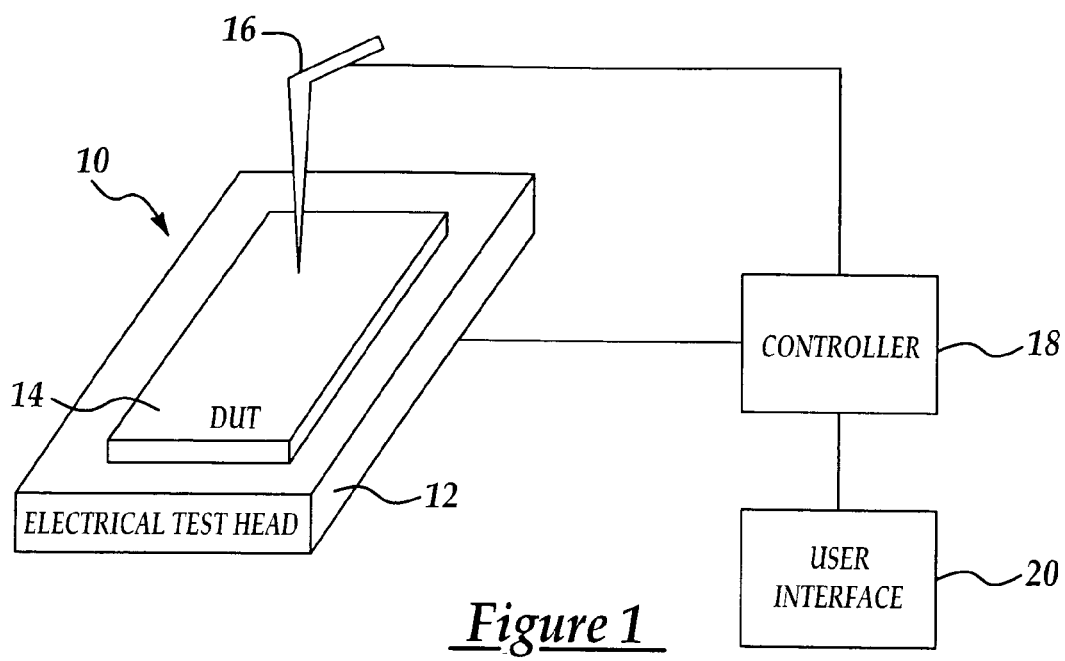
*Figure 1*
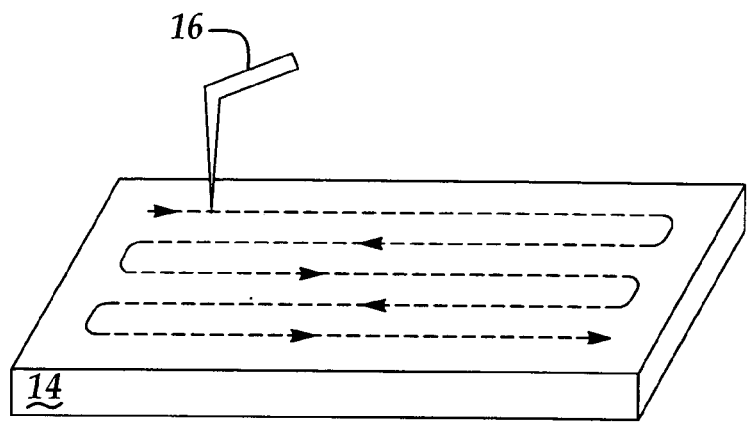
*Figure 2*
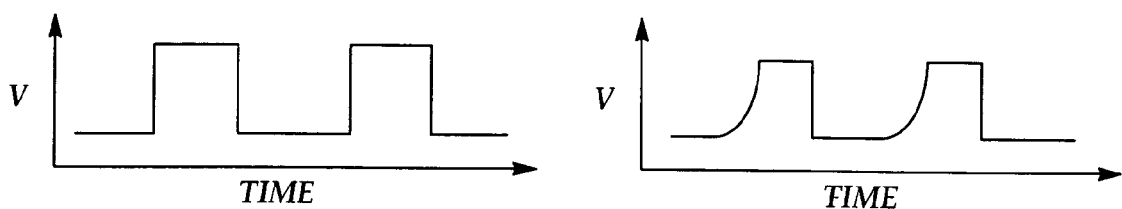
*Figure 3A*   *Figure 3B*

ELECTRICAL BIAS ELECTRICAL TEST APPARATUS AND METHOD

BACKGROUND OF THE INVENTION

1. Field of the Invention

The invention relates generally to methods for testing microelectronic products. More particularly, the invention relates to methods for efficiently testing microelectronic products.

2. Description of the Related Art

Integral to the fabrication of microelectronic products is the electrical testing of microelectronic products. The electrical testing of microelectronic products is undertaken for purposes of assuring the reliability and functionality of microelectronic products.

While the electrical testing of microelectronic products is essential for their fabrication, such electrical testing is nonetheless not entirely without problems. In that regard, it is often difficult to accurately and efficiently electrically test microelectronic products. It is towards the foregoing object that the invention is directed.

Various electrical test apparatus and methods have been disclosed in microelectronic product fabrication art.

Included but not limited among the apparatus and methods are those disclosed within: (1) Lo, in U.S. Pat. No. 6,462,814 (an optical stress apparatus and method for electrically testing a microelectronic product); and (2) Bruce et al., in Soft Defect Localization (SDL) on ICs, Proc. 28$^{th}$ Int. Symp. For Testing and Failure Analysis, 3–7 Nov. 2002, Phoenix, Ariz., pp. 21–27 (an additional optical stress apparatus and method for electrically testing a microelectronic product). The disclosures of the foregoing references are incorporated herein fully by reference.

Desirable are additional apparatus and methods for electrically testing microelectronic products. The invention is directed towards the foregoing object.

SUMMARY OF THE INVENTION

A first object of the invention is to provide an apparatus and a method for electrically testing a microelectronic product.

A second object of the invention is to provide an apparatus and a method in accord with the first object of the invention, wherein the microelectronic product is accurately and efficiently electrically tested.

In accord with the objects of the invention, the invention provides an apparatus and a method for electrically testing a microelectronic product.

In accord with the invention, the apparatus comprises an electrical test head to which is mated a microelectronic product for electrically testing the microelectronic product. The apparatus also comprises a movable electrical probe tip positioned with respect to the electrical test head as to movably electrically stress a portion of the microelectronic product other than an electrical contact portion of the microelectronic product.

The apparatus in accord with the invention contemplates a method for use thereof for testing a microelectronic product in accord with the invention.

The invention provides an apparatus and a method for accurately and efficiently electrically testing a microelectronic product. The invention realizes the foregoing object within the context of a apparatus comprising: (1) an electrical test head to which is mated a microelectronic product for electrically testing the microelectronic product; and (2) a movable electrical probe tip positioned with respect to the electrical test head such as to movably electrically stress a portion of the microelectronic product other than an electrical contact portion of the microelectronic product. By employing within the invention an additional electrical probe tip bias and electrical stressing when electrically testing a microelectronic product, the microelectronic product may be more accurately and efficiently tested.

BRIEF DESCRIPTION OF THE DRAWINGS

The objects, features and advantages of the invention are understood within the context of the Description of the Preferred Embodiment, as set forth below. The Description of the Preferred Embodiment is understood within the context of the accompanying drawings, which form a material part of this disclosure, wherein:

FIG. 1 shows a schematic diagram of an apparatus in accord with the invention.

FIG. 2 shows a schematic diagram of an electrical probe tip bias stressing scheme of a microelectronic product in accord with the invention.

FIG. 3A and FIG. 3B show a pair of detected signal timing diagrams within and without an electrical probe tip bias stressing in accord with the invention.

DESCRIPTION OF THE PREFERRED EMBODIMENT

Figure 4A:
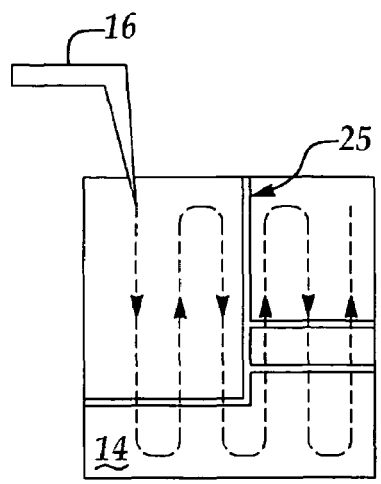
FIG. 4A and FIG. 4B show a pair of diagrams illustrating determination of a defective circuit element map while employing an electrical probe tip bias stressing in accord with the invention.

The invention provides an apparatus and a method for accurately and efficiently electrically testing a microelectronic product. The invention realizes the foregoing object within the context of a apparatus comprising: (1) an electrical test head to which is mated a microelectronic product for electrically testing the microelectronic product; and (2) a movable electrical probe tip positioned with respect to the electrical test head such as to movably electrically stress a portion of the microelectronic product other than an electrical contact portion of the microelectronic product. By employing within the invention the additional electrical probe tip bias stressing when electrically testing the microelectronic product, the microelectronic product may be more accurately and efficiently tested.

FIG. 1 shows a schematic diagram of an apparatus 10 in accord with the preferred embodiment of the invention.

The apparatus 10 comprises an electrical test head 12 which will generally employ an array of contact probes for mating with an array of bond pads within a microelectronic product 14. Within FIG. 1, the array of contact probes is on the top of the electrical test head 12 and the array of bond pads is on the bottom side of the microelectronic product 14. Thus, both are obscured. The microelectronic product 14 may alternatively be designated as a device under test (DUT). The microelectronic product 14 may be selected from the group including but not limited to integrated circuit products (i.e. semiconductor die), ceramic substrate products and optoelectronic products. Within the configuration as illustrated within FIG. 1, the microelectronic product 14 may be subject to routine electrical tests that are intended to assure functionality, reliability and quality of the microelectronic product 14.

FIG. 1 also shows an electrical probe tip 16 movably positioned with respect to the microelectronic product 14 and the electrical test head 12 such as to electrically stress a portion of the microelectronic product 14 other than an electrical contact portion (i.e., bond pad portion or patterned conductor layer portion) of the microelectronic product 14. The electrical stress provided to the microelectronic product 14 through the electrical probe tip 16 may be provided employing either a positive bias or a negative bias. Typically, a bias voltage is in a range of from about +/−3 to about +/−5 volts.

The electrical test apparatus 10 still further comprises a controller 18 that is intended to control the movement of the electrical probe tip 16 and to coincidently collect electrical test data from the electrical test head 12 at such times when the electrical probe tip 16 is electrically biased with respect to the microelectronic product 14.

Finally, FIG. 2 illustrates a user interface 20 that is intended for access and programming of the controller 18, as well as mapping of results of electrical probe tip 16 stressing of the microelectronic product 14 and electrical testing of the microelectronic product 14.

FIG. 2 shows a pattern of travel for the electrical probe tip 16 with respect to the microelectronic product 14 when electrically stressing the microelectronic product 14 at other than an electrical contact portion of the microelectronic product 14. In accord with FIG. 2, the electrical probe tip 16 stress pattern is serpentine. The electrical probe tip 16 may be picked and placed when simultaneously electrically stressing and electrically testing the microelectronic product 14. Alternatively, the electrical probe tip 16 may be dragged along the surface of the microelectronic product 14, provided that the microelectronic product 14 is not coincidentally damaged thereby.

FIG. 3A and FIG. 3B show a pair of voltage versus time graphs that may be employed for determining electrical component or structure failure within a microelectronic product. Both FIG. 3A and FIG. 3B are intended as timing diagrams for electrical signal passage through a microelectronic product. FIG. 3A illustrates an ideally expected timing diagram with sharp timing transitions. FIG. 3B illustrates a skewed timing diagram which may be obtained, for example, due to electrical stress induced incipient failure of a microelectronic device or an electrical connection within a microelectronic product.

Figure 4B:
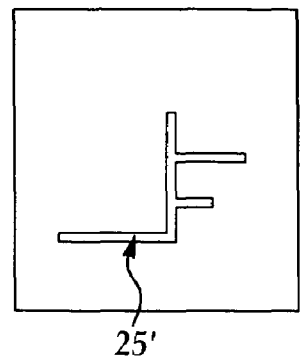

FIG. 4A and FIG. 4B illustrate a pair of mapping diagrams illustrating how the invention may be employed for mapping a defective portion of a microelectronic product.

FIG. 4A shows the microelectronic product 14 generally in accord with FIG. 2 and the electrical probe tip 16 positioned thereupon, electrically biased and intended to be traced in a serpentine fashion over the microelectronic product 14 which has formed therein a circuit element 25. By simultaneously scanning the electrical probe tip 16 over the microelectronic product 14 while electrically testing the microelectronic product in accord with a differentiation of the timing diagrams of FIG. 3A and FIG. 3B, defective portions of the circuit element 25 may be mapped. Such mapped portions are illustrated in FIG. 4B as defective circuit element portions 25'.

Figure 5A:
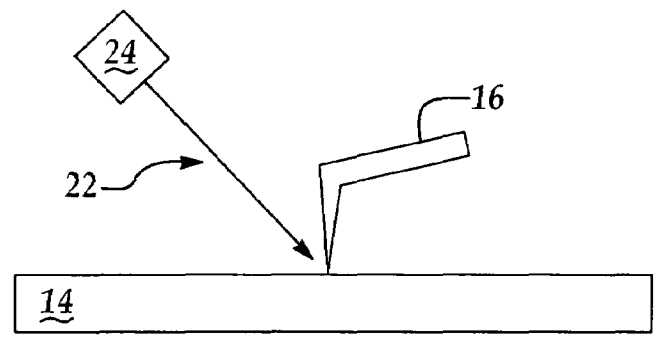
FIG. 5A and FIG. 5B show a pair of schematic diagrams of a pair of alternate embodiments of the invention.

While the preferred embodiment of the invention as illustrated in FIG. 1 illustrates the invention within the context of an electrical probe tip 16 biasing of a microelectronic product 14 while electrically testing the microelectronic product 14, the invention is not intended to be so limited. Rather, FIG. 5A illustrates an additional embodiment of the invention having both an electrical probe tip 16 biasing of a portion of the microelectronic product 14 and a radiation beam 22 irradiation of the portion of the microelectronic product 14. The radiation beam 22 may be selected from the group including but not limited to laser beams and electron beams. The radiation beam 22 issues from a radiation beam source 24. Both the electrical probe tip 16 biasing and the radiation beam 22 irradiation may be provided on either the front side of the microelectronic product 14 or the back side of the microelectronic product 14 when electrically testing the microelectronic product 14.

Figure 5B:
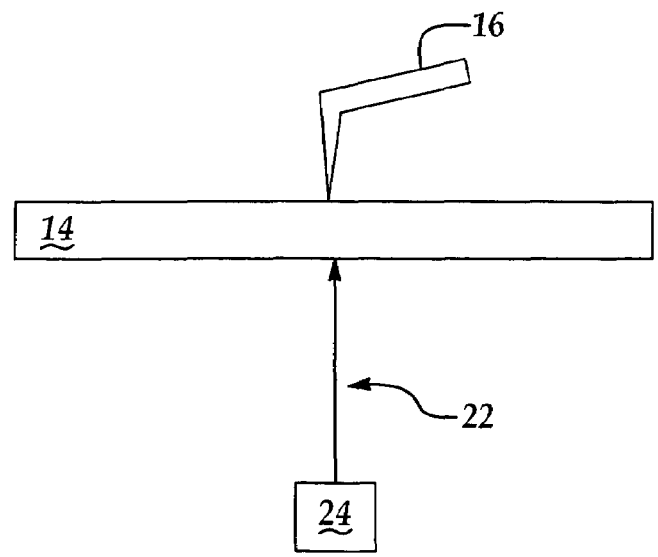

FIG. 5B shows a correlating diagram illustrating an electrical probe tip 16 biasing of a portion of a microelectronic product 14 being on an opposite side of the microelectronic product 14 from a radiation beam 22 irradiation of the portion of the microelectronic product 14 when electrically testing the microelectronic product 14.

The foregoing description describes several preferred embodiments of the invention. The preferred embodiments each employ an electrical probe tip biasing of a portion of a microelectronic product other than an electrical contact portion of the microelectronic product when electrically testing the microelectronic product. Incident to such electrical probe tip biasing of the microelectronic product the microelectronic product may be more accurately and efficiently electrically tested.

The preferred embodiments of the invention are illustrative of the invention rather than limiting of the invention. Revisions and modifications may be made to methods, materials, structures and dimensions in accord with the preferred embodiment and examples of the invention while still providing embodiments of the invention, further in accord with the accompanying claims.

What is claimed is:

1. An apparatus for electrically testing a microelectronic product while moveably applying an electrical stress comprising:
  an electrical test head to which is mated a microelectronic product for electrically testing the microelectronic product;
  a movable electrical probe tip separately positionable from said electrical test head during electrical testing such as to electrically stress a portion of the microelectronic product other than an electrical contact portion of the microelectronic product while said electrical test head is simultaneously positionable to electrically contact said electrical contact portion to produce electrical test data for said microelectronic product; and
  a radiation beam source positioned with respect to the electrical probe tip such as to simultaneously radiation stress the portion of the microelectronic product other than the electrical contact portion of the microelectronic product.

2. The apparatus of claim 1 wherein the microelectronic product is a semiconductor product.

3. The apparatus of claim 1 wherein the microelectronic product is a ceramic substrate product.

4. The apparatus of claim 1 wherein the microelectronic product is an optoelectronic product.

5. The apparatus of claim 1 further comprising a controller which:
  controls the electrical probe tip positioning and biasing with respect to the portion of the microelectronic product other than the electrical contact portion of the microelectronic product; and
  simultaneously collects said electrical test data from the electrical test head.

6. The apparatus of claim 1 wherein the electrical probe tip and the radiation beam source are on the same side of the microelectronic product.

7. The apparatus of claim 1 wherein the electrical probe tip and the radiation beam source are on opposite sides of the microelectronic product.

8. A method for electrically testing a microelectronic product while moveably applying an electrical stress comprising:

providing an electrical test apparatus comprising:

an electrical test head to which is mated a microelectronic product for electrically testing the microelectronic product; and a movable electrical probe tip separately positionable from said electrical test head during electrical testing such as to electrically stress a portion of the microelectronic product other than an electrical contact portion of the microelectronic product while said electrical test head is simultaneously positionable to electrically contact said electrical contact portion to produce electrical test data for said microelectronic product;

sequentially movably positioning the electrical probe tip to sequential positions comprising said other than an electrical contact portion of the semiconductor product and electrically stressing the microelectronic product with said electrical probe tip while simultaneously electrically testing the microelectronic product with said electrical test head electrically contacting said electrical contact portion to produce said electrical test data for said microelectronic product; and providing a radiation beam source positioned with respect to the electrical probe tip such as to simultaneously radiation stress the portion of the microelectronic product other than the electrical contact portion of the microelectronic product.

9. The method of claim 8 wherein the microelectronic product is a selected from the group consisting of a semiconductor product and a ceramic substrate product.

10. The method of claim 8 wherein the microelectronic product is an optoelectronic product.

11. The method of claim 8 further comprising providing a controller which:

controls the electrical probe tip positioning and biasing with respect to the portion of the microelectronic product other than the electrical contact portion of the microelectronic product; and simultaneously collects said electrical test data from the electrical test head.

12. The method of claim 8 wherein the electrical probe tip and the radiation beam source are on the same side of the microelectronic product.

13. The method of claim 8 wherein the electrical probe tip and the radiation beam source are on opposite sides of the microelectronic product.

14. A method for electrically testing a semiconductor product while moveably applying an electrical stress comprising:

providing an electrical test apparatus comprising:

an electrical test head to which is mated a semiconductor product for electrically testing the semiconductor product; and a movable electrical probe tip separately positionable from said electrical test head during electrical testing such as to electrically stress a portion of the semiconductor product other than an electrical contact portion of the semiconductor product while said electrical test head is simultaneously positionable to electrically contact said electrical contact portion to produce electrical test data for said semiconductor product;

sequentially movably positioning the electrical probe tip to sequential positions comprising said other than an electrical contact portion of the semiconductor product and electrically stressing the semiconductor product with said electrical probe tip while simultaneously electrically testing the semiconductor product with said electrical test head electrically contacting said electrical contact portion to produce said electrical test data for said semiconductor product; and providing a radiation beam source positioned with respect to the electrical probe tip such as to simultaneously radiation stress the portion of the semiconductor product other than the electrical contact portion of the semiconductor product.

15. The method of claim 14 further comprising providing a controller which:

controls the electrical probe tip positioning and biasing with respect to the portion of the semiconductor product other than the electrical contact portion of the semiconductor product; and simultaneously collects said electrical test data from the electrical test head.

16. The method of claim 14 wherein the electrical probe tip and the radiation beam source are on the same side of the semiconductor product.

17. The method of claim 14 wherein the electrical probe tip and the radiation beam source are on opposite sides of the semiconductor product.

* * * * *